United States Patent
Kumar et al.

(10) Patent No.: US 6,629,194 B2
(45) Date of Patent: Sep. 30, 2003

(54) METHOD AND APPARATUS FOR LOW POWER MEMORY BIT LINE PRECHARGE

(75) Inventors: Sudarshan Kumar, Fremont, CA (US); Gaurav G. Mehta, Folsom, CA (US); Sadhana Madhyastha, Los Altos, CA (US); Jiann-Cherng Lan, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 46 days.

(21) Appl. No.: 09/872,965

(22) Filed: May 31, 2001

(65) Prior Publication Data

US 2002/0184431 A1 Dec. 5, 2002

(51) Int. Cl.$^7$ .............................................. G06F 12/00
(52) U.S. Cl. ...................... 711/104; 711/5; 365/185.25; 365/230.03; 365/230.66
(58) Field of Search ................. 711/5, 104; 365/185.28, 365/230.03, 230.06, 185.25

(56) References Cited

U.S. PATENT DOCUMENTS

| 5,384,734 | A | * | 1/1995 | Tsujihashi et al. ..... 365/189.04 |
| 5,463,590 | A | * | 10/1995 | Watanabe .................... 365/203 |
| 5,481,495 | A | * | 1/1996 | Henkels et al. ......... 365/189.02 |
| 5,699,309 | A | * | 12/1997 | Cronin et al. ................ 365/203 |
| 5,828,610 | A | * | 10/1998 | Rogers et al. ......... 365/189.02 |
| 5,828,612 | A | * | 10/1998 | Yu et al. ..................... 365/203 |
| 5,949,719 | A | * | 9/1999 | Clinton et al. ......... 365/189.01 |
| 6,160,733 | A | * | 12/2000 | Ebel ........................... 365/154 |
| 6,255,900 | B1 | * | 7/2001 | Chang et al. ................ 327/589 |
| 6,381,188 | B1 | * | 4/2002 | Choi et al. .................. 365/222 |

* cited by examiner

Primary Examiner—Reba I. Elmore
(74) Attorney, Agent, or Firm—Cynthia T. Faatz

(57) ABSTRACT

A memory includes a plurality of banks of memory elements. For a memory read access operation, bank enable logic coupled to each of the plurality of banks is responsive to an address of a memory element to be read to selectively deactivate a first precharge clock signal to be received by a first one of the banks that includes the memory element to be read. The bank enable logic is further responsive to the address to selectively maintain in an active state a second precharge clock signal to be received by a second one of the banks that does not include the memory element to be read.

17 Claims, 5 Drawing Sheets

METHOD AND APPARATUS FOR LOW POWER MEMORY BIT LINE PRECHARGE

BACKGROUND

1. Field

An embodiment of the present invention relates to the field of memory read accesses and, more particularly, to a low power memory bit line precharge scheme.

2. Discussion of Related Art

The increasing power consumption of microprocessors and other integrated circuits (ICs) has become one of the major issues for current and next generation designs. Power-related costs (e.g. cooling and power delivery) can have a significant impact on the overall cost of an integrated circuit chip and, therefore, cut into profit margins in an increasingly competitive marketplace. Additionally, high power consumption and junction temperatures can limit the performance of high-end microprocessors and other ICs.

More particularly, register files and other memory can consume a significant percentage of power on a microprocessor, for example. For current and next generation microprocessors, the size and number of register files and/or memory structures on a microprocessor continues to increase such that the percentage of overall power dissipation attributable to these structures is also expected to rise.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for low power memory bit line precharging is described. In the following description, particular types of integrated circuits and circuit configurations are described for purposes of illustration. It will be appreciated, however, that other embodiments are applicable to other types of integrated circuits, and to circuits configured in another manner.

For one embodiment, a memory includes a plurality of banks of memory elements. Bank enable logic coupled to each of the plurality of banks, is responsive to an address of a memory element to be read to selectively deactivate a first precharge clock signal to be received by a first one of the banks that includes the memory element to be read. The bank enable logic is further responsive to the address of the memory element to be read to selectively maintain in an active state a second precharge clock signal to be received by a second one of the banks that does not include the memory element to be read. Further details of this and other embodiments are provided in the description that follows.

For purposes of example, embodiments of the invention are described below in reference to a register file on a microprocessor. It will be appreciated, however, that other embodiments may be applicable to a different type of memory that is organized in banks and/or to a memory provided on a different type of processor or other integrated circuit chip.

Figure 1:
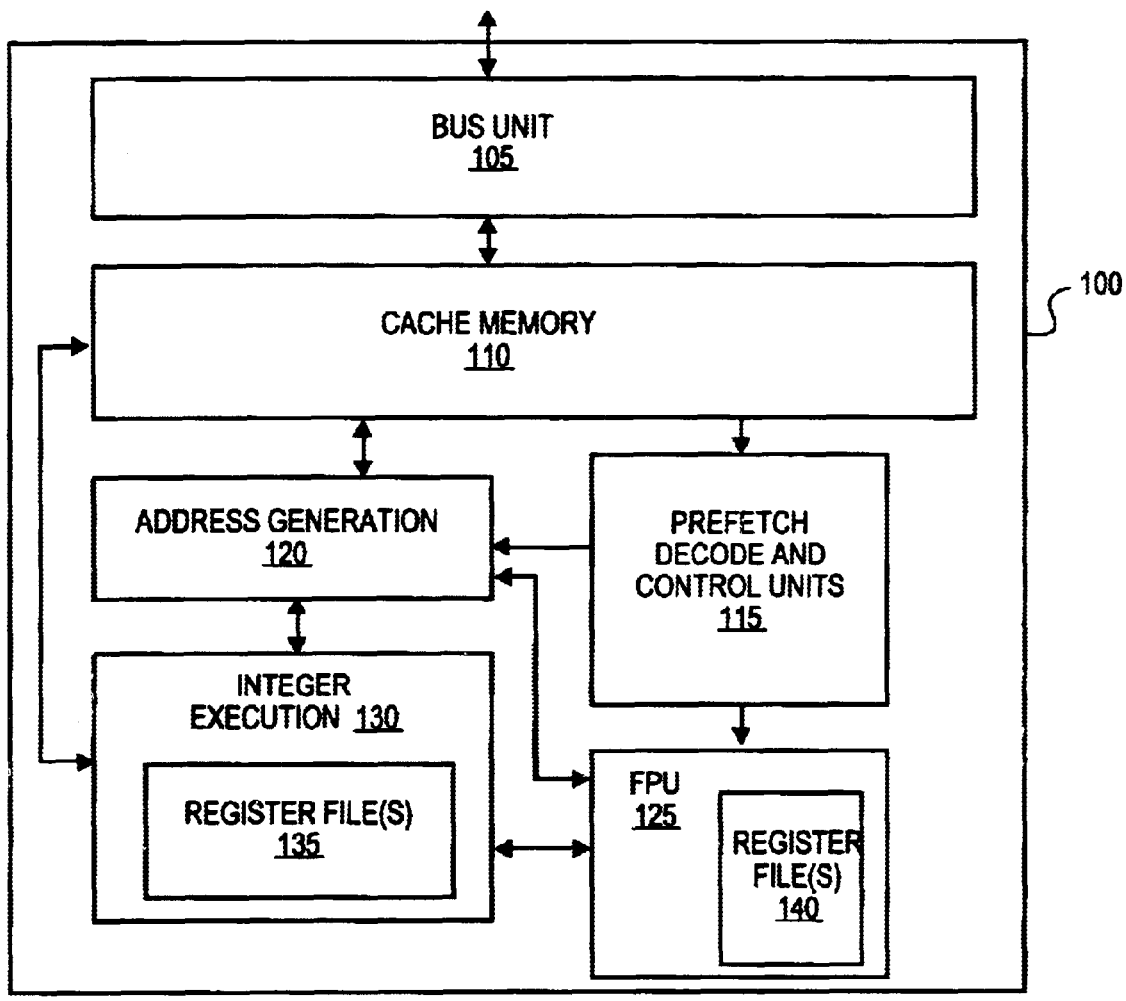
FIG. 1 is a block diagram of a processor in which the low power bit line precharge scheme of one embodiment may be advantageously used.

FIG. 1 is a block diagram of a processor 100 in which the memory bit line precharging approach of one embodiment may be advantageously used. The processor 100 may include, for example, a bus unit 105 to interface the processor 100 with an external bus (not shown), one or more cache memories 110 to store addresses and/or data, prefetch, decode and control units 115, an address generation unit 120, and floating point and integer execution units 125 and 130, respectively.

One or more register files 135 and/or 140 may be included on the processor 100 in, for example, the integer and/or floating point execution units 130 and 125, respectively. A register file is a set of registers used to temporarily store data for use in arithmetic and other operations, for example.

It will be appreciated that the processor 100 may include other functional blocks and/or other types of circuitry that are not shown in FIG. 1. Further, it will be appreciated that other integrated circuits, including other types of processors configured in a different manner than the processor 100 of FIG. 1, may also include register files and/or other types of memory in accordance with one or more embodiments.

Figure 2:
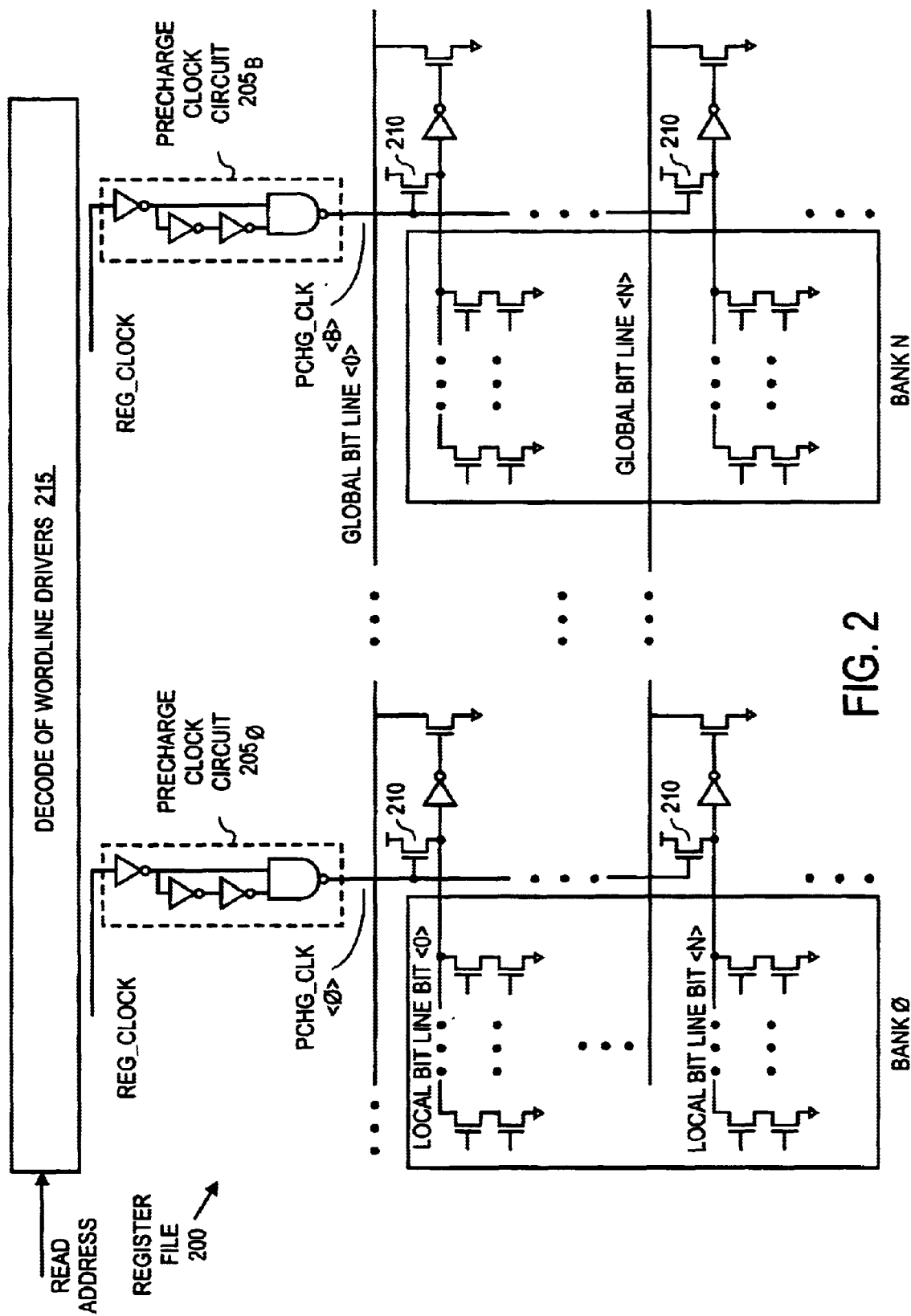
FIG. 2 is a schematic diagram showing the structure of a prior memory.

FIG. 2 is a schematic diagram of a prior register file 200 that may currently be used to provide one or more register files such as the register files 135 and/or 140. The register file 200 includes memory elements (also referred to as register cells) organized in B banks. Each row of memory elements in each bank is coupled to a respective local bit line. For example, the bank 0 includes N rows of memory elements, wherein each of the N rows of memory elements is coupled to a respective local bit line <0> . . . <N>. The local bit lines for a particular row of memory elements in each bank are logically OR'd together in the manner shown to drive a corresponding one of the global bit lines <0> . . . <N>.

For this exemplary register file 200, each bank is coupled to a corresponding precharge clock circuit $205_{0 \ldots B}$ such that each bank receives its own, separate precharge clock signal, pchg_clk <0> . . . <B>. Separate precharge clock signals may be provided for each of the banks to reduce clock skew as compared to a register file for which a single precharge clock generator provides a single precharge clock signal that is distributed to all the banks. As shown in FIG. 2, each of the precharge clock signals pchg_clk <0> . . . <B> for this example is derived from a register file clock signal reg_clock received by the register file 200.

In response to the reg_clock signal transitioning low, the outputs of each of the precharge clock circuits $205_{0 \ldots B}$ (providing the pchg_clk signals <0> . . . <B>) transition low four inversions later for this example. The pchg_clk signals <0> . . . <B> are delayed in this manner by the precharge clock circuits $205_{0 \ldots B}$ to avoid a power race condition between disabling of word lines and precharging of local bit lines. When each of the pchg_clk signals <0> . . . <B> transitions low, corresponding precharge devices 210 coupled to each of the local bit lines are enabled such that each of the local bit lines corresponding to each of the banks 0 . . . N is precharged high for this example.

When the reg_clock signal then transitions low, each of the pchg_clk signals <0> . . . <B> corresponding to each of the banks 0 . . . B transitions high two inversions later. In this manner, all of the precharge devices 210 are disabled and all of the local bit lines may be discharged in response to a register read operation.

In response to receiving a register read address for a register read operation, however, decoder logic and word line drivers 215 drive only one word line in only one of the banks—the bank that includes the memory element to be read. The appropriate local bit line in that bank is then enabled to provide the corresponding data value to the respective global bit line.

The local bit lines for the unaccessed banks remain at the precharged level. Thus, in accordance with the above approach, the precharge clock signals for the banks that are not being accessed are toggled unnecessarily during a read access.

Figure 3:
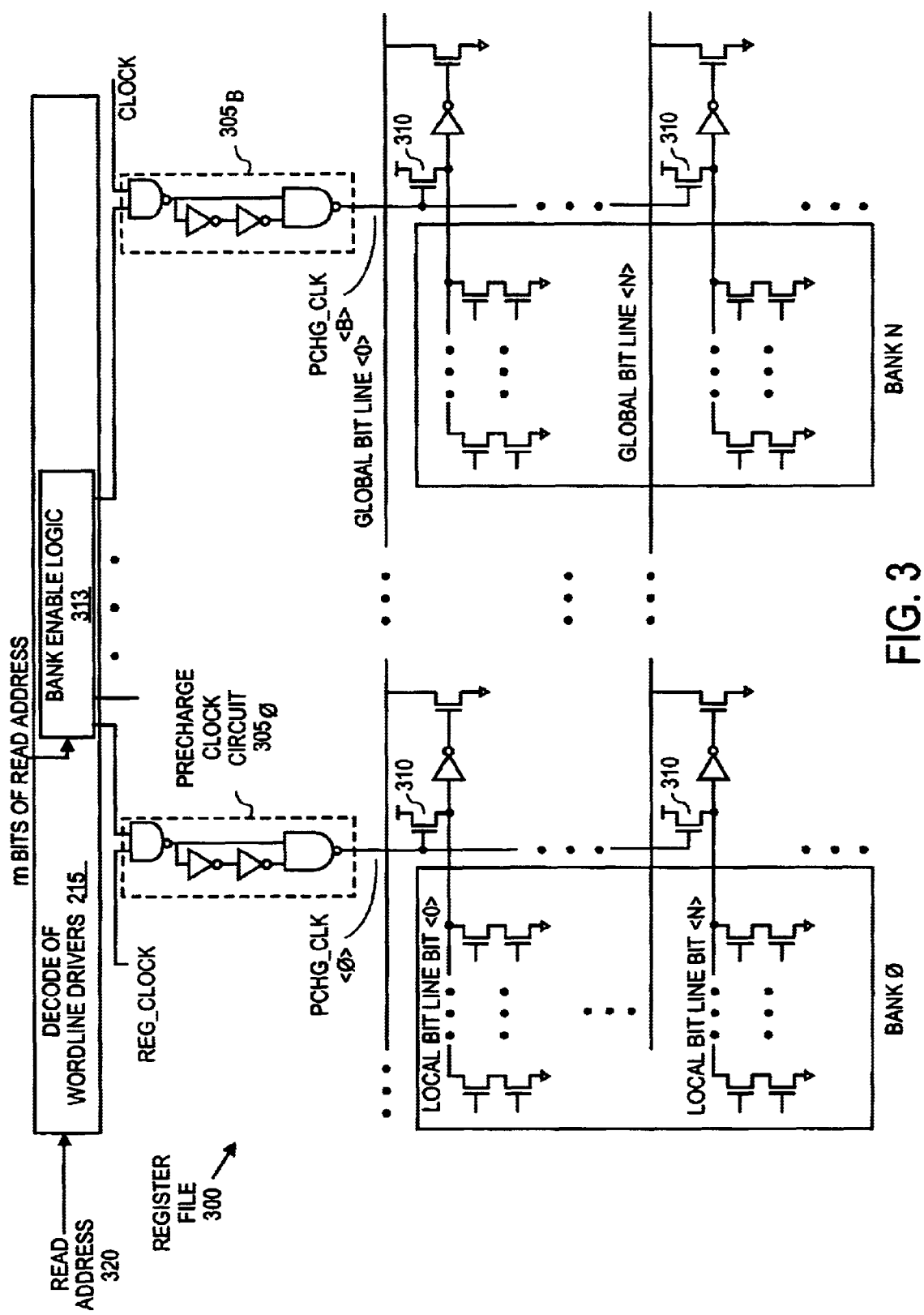
FIG. 3 is a schematic diagram of a memory in which the low power bit line precharge scheme of one embodiment is implemented.

FIG. 3 shows a register file 300 in accordance with one embodiment. In contrast to the above approach, for the register file 300, only the precharge clock signal for a bank that is being accessed is toggled in response to a register read operation. The remaining precharge clock signals corresponding to unaccessed banks are held active throughout the read operation.

Register file 300, like the register file 200 of FIG. 2, includes register memory elements organized in banks 0 . . . B. Each of the banks 0 . . . B receives a corresponding, separate precharge clock signal pchg_clk<0> . . . <B> that, for one embodiment, is derived by respective precharge clock circuitry $305_0 \ldots {}_B$ from a register clock signal reg_clock. The precharge clock signals pchg_clk <0> . . . <B> for this example, enable precharge devices 310 to precharge local bit lines of the corresponding banks when the precharge clock signals <0> . . . <B> are activated (i.e. low in this example). When any of the pchg_clk signals <0> . . . <B> is deactivated, the corresponding precharge devices 310 are turned off such that the local bit lines of the corresponding bank are allowed to be discharged in response to a memory read operation.

The precharge clock circuits $305_{0\text{-}B}$ are different from the precharge clock circuits $205_0 \ldots {}_B$ of FIG. 2, however. While the precharge clock circuits $205_0 \ldots {}_B$ merely delay the register clock or other input clock signal to provide a corresponding precharge clock signal, the precharge clock circuits $305_0 \ldots {}_B$ also control the corresponding precharge clock signal depending on the particular bank being accessed for a memory read operation. It will be appreciated that, while a specific configuration is shown for precharge clock circuits $305_0 \ldots {}_B$, for other embodiments, the precharge clock circuits may be configured in a different manner to perform a similar function. For example, the precharge clock circuits of other embodiments may provide a different delay between the input clock signal and the output precharge clock signal.

For one embodiment, as shown in FIG. 3, the register file 300 includes bank enable logic 313 that may be included, for example, in decode and word line driver logic 315. The bank enable logic 313 is coupled to each of the precharge clock circuits $305_0 \ldots {}_B$ and operates in conjunction with the precharge clock circuits $305_0 \ldots {}_B$ to selectively deactivate or maintain active the respective pchg_clk signal depending on the particular bank to be accessed. For one embodiment, the bank enable logic 313 controls each of the precharge clock circuits $305_0 \ldots {}_B$ through bank enable signals $BE_0 \ldots {}_B$ provided at outputs of the bank enable logic 313 in the manner described below.

It will be appreciated that the register file 300 may be configured in a different manner for other embodiments and/or may include additional circuitry not shown in FIG. 3. For example, the register file 300 may include global bit line precharge circuitry to precharge each of the global bit lines <0> . . . <N> prior to a register access operation.

In operation, in response to the reg_clock signal transitioning low, regardless of the value of the corresponding bank enable signal BE, each of the precharge clock signals pchg_clk <0> . . . <B> transitions low to enable the precharge devices 310 for all of the banks 0 . . . B.

For a memory read operation, the register file 300 receives an address of the memory element to be accessed 320. This register read address 320 is provided to the decode logic and word line drivers 315 to determine which of multiple word lines of the register file 300 should be asserted to access the desired memory element. For one embodiment, a portion of the read address 320 (m bits of the read address 320 for this example) is also provided to the bank enable logic 313 to identify the particular bank that is being accessed. Then, in response to receiving the portion of the read address 320 that identifies the particular bank to be accessed, the bank enable logic 313 asserts the corresponding one of the bank enable signals $BE_0 \ldots {}_B$.

Figure 4:
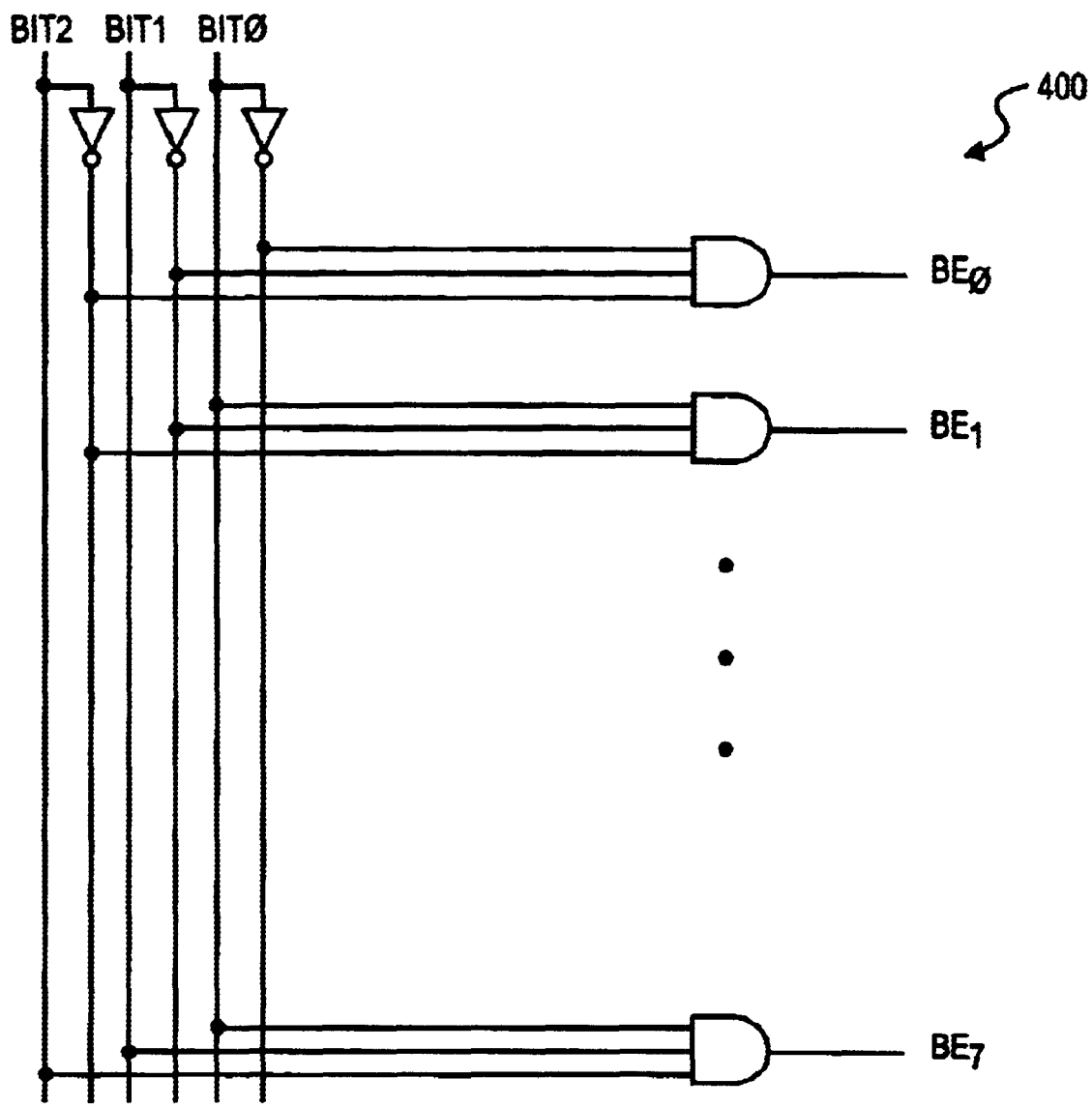
FIG. 4 is a schematic diagram of a decoder circuit that may be used to implement bank enable logic of FIG. 3 for one embodiment.

For example, where the register file 300 includes eight banks of memory elements <0> . . . <7>, the bank enable logic 313 may receive the three most significant bits of the register read address 320 and, in response, assert the corresponding bank enable signal BE. For this example, the bank enable logic 313 may be implemented using a 3:8 decoder circuit such as the 3:8 decoder circuit 400 of FIG. 4. It will be appreciated that, for other embodiments, a different number of banks may be provided and/or the bank enable logic 313 may be implemented in a different manner or in a different location to perform a similar function.

For purposes of example, it is assumed that the read address 320 indicates a memory element to be read from bank 0. As described above, the m bits of the memory read address that uniquely identify the bank in which the memory element is located are provided to the bank enable logic 313. In response to receiving the m bits of the read address 320, the bank enable logic 313 asserts the $BE_0$ signal while the remaining bank enable signals remain deasserted (low in this example).

When the reg_clock or other input clock signal transitions high for this embodiment, after a delay through the precharge clock circuit $305_0$, the pchg_clk <0> signal transitions high. When the pchg_clk <0> signal transitions high, the corresponding precharge devices 310 coupled to the local bit lines for bank 0 are disabled. In this manner, when the appropriate memory element is selected to be read, the corresponding local bit line in bank 0 may be discharged.

Concurrently, at the precharge clock circuit $305_B$, when the reg_clock signal transitions high, because the corresponding bank enable signal $BE_B$ is low, the precharge clock circuit $305_B$ maintains the corresponding pchg_clk <B> signal in an active state, i.e. low for this example. Other pchg_clk signals corresponding to other unaccessed banks of the register file 300 are maintained in an active state in a similar manner.

Then, in response to the reg_clock signal transitioning low, the pchg_clk <0> signal is again activated to precharge the local bit lines for the bank 0. The other pchg_clk <1 . . . B> signals, however, are already in an active state, and thus, are not toggled in response to this reg_clock transition. During a subsequent low to high transition of the reg_clock signal, a different bank enable signal may be asserted depending on the particular memory element to be read.

For other embodiments, where more than one bank may be accessed for a given memory read operation, only the precharge clock signals associated with the banks to be accessed are deactivated for the memory read operation. The remaining precharge clocks signals associated with banks that are not to be accessed for the read operation are held active to precharge the corresponding local bit lines. For such an embodiment, the bank enable logic may be configured in a different manner.

Thus, in accordance with the above-described embodiments, for a memory that is organized in banks, only the precharge clock signal associated with a bank to be accessed is toggled in response to a memory read operation. By only toggling the precharge clock signal(s) that correspond to a bank to be accessed for a particular memory read operation, power consumed by local bit line precharge circuitry can be reduced. For one embodiment, local bit line power can be reduced by approximately (B−1)/B where B is the total number of banks in the memory.

The above-described approach helps to reduce memory local bit line precharging power dissipation when the memory is active. For another embodiment, to provide further power reduction when the memory is not active, the above approach may be used in conjunction with an idle power clock gating approach in which the input clock signal to the memory (the reg__clock signal in the example above) is turned off if the memory is not being accessed.

Figure 5:
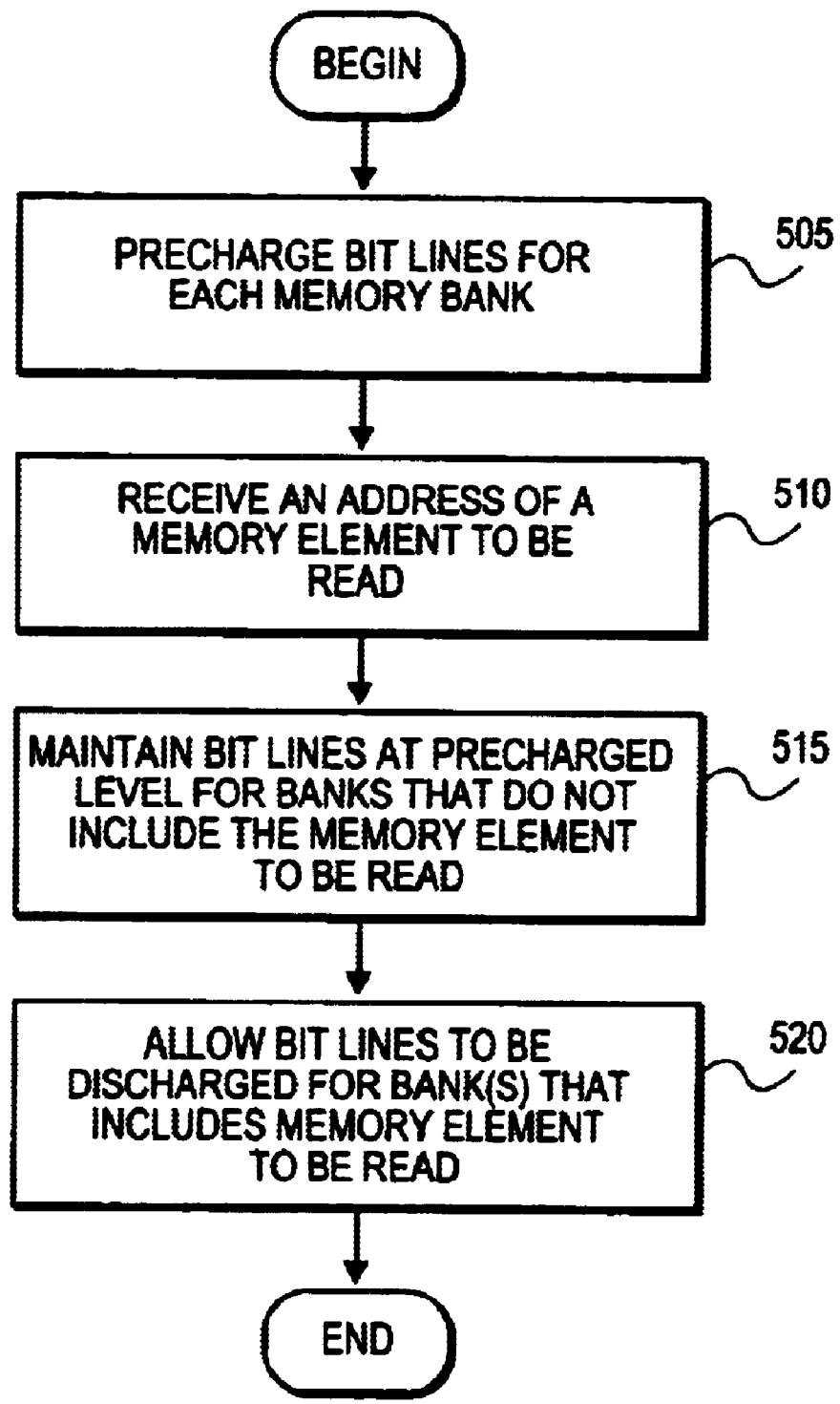
FIG. 5 is a flow diagram showing a method for controlling memory bit line precharging for a memory read operation in accordance with one embodiment.

FIG. 5 is a flow diagram showing a method of one embodiment for low power memory bit line precharging. At block 505, bit lines for each memory bank in a multi-bank memory are precharged. An address of a memory element to be read is then received at block 510.

In response to receiving the address of the memory element to be read, at block 515, for banks that do not include the memory element to be read, the bit lines are maintained at the precharged voltage level throughout the corresponding memory read operation. For one embodiment, maintaining the bit lines at the precharged level includes keeping a corresponding precharge clock signal active. At block 520, the bit lines associated with the bank including the memory element to be read are allowed to discharge during the memory read operation. For one embodiment, allowing the bit lines to precharge includes inactivating a corresponding precharge clock signal.

For other embodiments, additional actions may be included. Further, it will be appreciated that the actions described above may be performed in a different order or may overlap in timing for some embodiments.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
   a static random access memory including a plurality of banks of memory elements; and
   bank enable logic coupled to each of the plurality of banks, the bank enable logic being responsive to an address of a memory element to be read to selectively deactivate a first precharge clock signal to be received by a first one of the banks that includes the memory element to be read and to selectively maintain in an active state a second precharge clock signal to be received by a second one of the banks that does not include the memory element to be read.

2. The apparatus of claim 1 wherein the static random access memory is a register file and the memory elements are register cells.

3. The apparatus of claim 2 further comprising
   a first precharge clock circuit coupled to the first bank and a second precharge clock circuit coupled to the second bank, the first precharge clock circuit to delay an input clock signal to provide the first precharge clock signal, the second precharge clock circuit to delay the input clock signal to provide the second precharge clock signal.

4. The apparatus of claim 1 wherein the bank enable logic comprises a decoder, the decoder to selectively deactivate the first precharge clock signal and to selectively maintain the second precharge clock signal in an active state in response to decoding a portion of the address of the memory element to be read.

5. An apparatus comprising:
   a static random access memory including first and second banks of memory elements;
   a first precharge clock generator coupled to the first bank;
   a second precharge clock generator coupled to the second bank, the first and second precharge clock generators to provide first and second precharge clock signals to the corresponding banks, the first and second precharge clock signals having a precharge level and an evaluate level; and
   a bank enable circuit coupled to each of the plurality of banks, the bank enable circuit being responsive to an address of a memory element to be read to selectively maintain a first one of the first and second precharge clock signals at the precharge level throughout a memory read operation if the corresponding bank does not include the memory element to be read, and to selectively cause the second one of the first or second precharge clock signals to transition to the evaluate level during the memory read operation if the corresponding bank includes the memory element to be read.

6. The apparatus of claim 5 wherein the static random access memory comprises a register file.

7. The apparatus of claim 5 wherein the bank enable circuit comprises a decoder to decode a portion of the address of the memory element to be read,
   the bank enable circuit being responsive to the portion of the address to assert a bank enable signal corresponding to the bank that includes the memory element to be read to selectively cause the second one of the first or second precharge clock signals to transition to the evaluate level during the memory read operation.

8. A processor comprising:
   an execution unit; and
   a register file comprising static random access memory coupled to the execution unit, the register file including a plurality of banks of memory elements; and
   bank enable logic coupled to each of the plurality of banks, the bank enable logic being responsive to an address of a memory element to be read to selectively deactivate a first precharge clock signal to be received by a first one of the banks that includes the memory element to be read and to selectively maintain in an active state a second precharge clock signal to be received by a second one of the banks that does not include the memory element to be read.

9. The processor of claim 8 wherein the bank enable logic comprises a decoder to decode a portion of the address.

10. The processor of claim 9 wherein, in response to decoding the portion of the address, the bank enable logic is to assert a bank enable signal corresponding to the second bank to maintain the second precharge signal in an active state.

11. The processor of claim 8 wherein the register file comprises eight banks of memory elements.

12. A method comprising:
   precharging bit lines in each of a plurality of banks of a static random access memory using a respective precharge clock signal;
   receiving an address of a memory element to be read;
   for each of the plurality of banks that does not include the memory element to be read, maintaining the respective precharge clock signal in an asserted state; and
   for the bank that includes the memory element to be read, deasserting the respective precharge clock signal in response to a memory read operation.

13. The method of claim 12 further comprising:
   decoding a portion of the address to determine which of the plurality of banks includes the memory element to be read,
   asserting a bank enable signal corresponding to the bank that includes the memory element to be read, and
   in response to asserting the bank enable signal, controlling the respective precharge clock signal to allow the corresponding bit lines to be discharged.

14. A method comprising:
   providing a static random access memory including a plurality of banks of memory elements; and
   providing bank enable logic coupled to each of the plurality of banks, the bank enable logic being responsive to an address of a memory element to be read to selectively deactivate a first precharge clock signal to be received by a first one of the banks that includes the memory element to be read and to selectively maintain in an active state a second precharge clock signal to be received by a second one of the banks that does not include the memory element to be read.

15. The method of claim 14 wherein
   providing the static random access memory comprises providing a register file.

16. The method of claim 15 further comprising
   providing a first precharge clock circuit coupled to the first bank and a second precharge clock circuit coupled to the second bank, the first precharge clock circuit to delay an input clock signal to provide the first precharge clock signal, the second precharge clock circuit to delay the input clock signal to provide the second precharge clock signal.

17. The method of claim 14 wherein
   providing the bank enable logic comprises providing a decoder, the decoder to selectively deactivate the first precharge clock signal and to selectively maintain the second precharge clock signal in an active state in response to decoding a portion of the address of the memory element to be read.

* * * * *